United States Patent
Kaku

(10) Patent No.: US 8,248,865 B2
(45) Date of Patent: Aug. 21, 2012

(54) NONVOLATILE SEMICONDUCTOR MEMORY DEVICE, METHOD OF SUPPLYING VOLTAGE IN THE SAME, AND SEMICONDUCTOR DEVICE

(75) Inventor: Daichi Kaku, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 138 days.

(21) Appl. No.: 12/958,619

(22) Filed: Dec. 2, 2010

(65) Prior Publication Data

US 2011/0255329 A1  Oct. 20, 2011

(30) Foreign Application Priority Data

Apr. 19, 2010  (JP) .................................. 2010-095580

(51) Int. Cl.
*G11C 5/14*  (2006.01)

(52) U.S. Cl. ............... 365/189.09; 365/148; 365/189.11; 365/189.14; 365/230.06

(58) Field of Classification Search ................... 365/148, 365/189.09, 189.11, 189.14, 230.06
See application file for complete search history.

(56) References Cited

U.S. PATENT DOCUMENTS

| | | | |
|---|---|---|---|
| 6,421,295 B1 * | 7/2002 | Mao et al. ................ | 365/230.06 |
| 6,532,167 B2 * | 3/2003 | Kaneko et al. ............. | 365/149 |
| 7,349,281 B2 | 3/2008 | Kouchi et al. | |
| 7,430,149 B2 * | 9/2008 | Yoshinaga et al. ............. | 365/226 |
| 7,586,788 B2 * | 9/2009 | Mawatari et al. ........... | 365/185.2 |
| 7,679,968 B2 * | 3/2010 | Yamauchi et al. ........ | 365/185.29 |
| 7,924,598 B2 * | 4/2011 | Hase et al. ..................... | 365/100 |
| 2009/0201713 A1 | 8/2009 | Shin et al. | |
| 2010/0182858 A1 | 7/2010 | Kaku et al. | |

FOREIGN PATENT DOCUMENTS

| JP | 2005-262642 | 3/2007 |
|---|---|---|
| JP | 2009-193660 | 8/2009 |

* cited by examiner

*Primary Examiner* — Pho M Luu

(74) *Attorney, Agent, or Firm* — Turocy & Watson, LLP

(57) ABSTRACT

A memory cell array is configured as an arrangement of memory cells. A first voltage generating circuit is configured to, during a write operation on the memory cells, generate and supply to the memory cell array a first voltage from a constant voltage, and to, during a read operation on the memory cells, generate and supply to the memory cell array a second voltage from a power supply voltage. A second voltage generating circuit is configured to generate the constant voltage. A selector circuit is configured to, during the write operation, drive the second voltage generating circuit to supply to the first voltage generating circuit the constant voltage, and to, during the read operation, stop the second voltage generating circuit and supply to the first voltage generating circuit the power supply voltage.

20 Claims, 5 Drawing Sheets

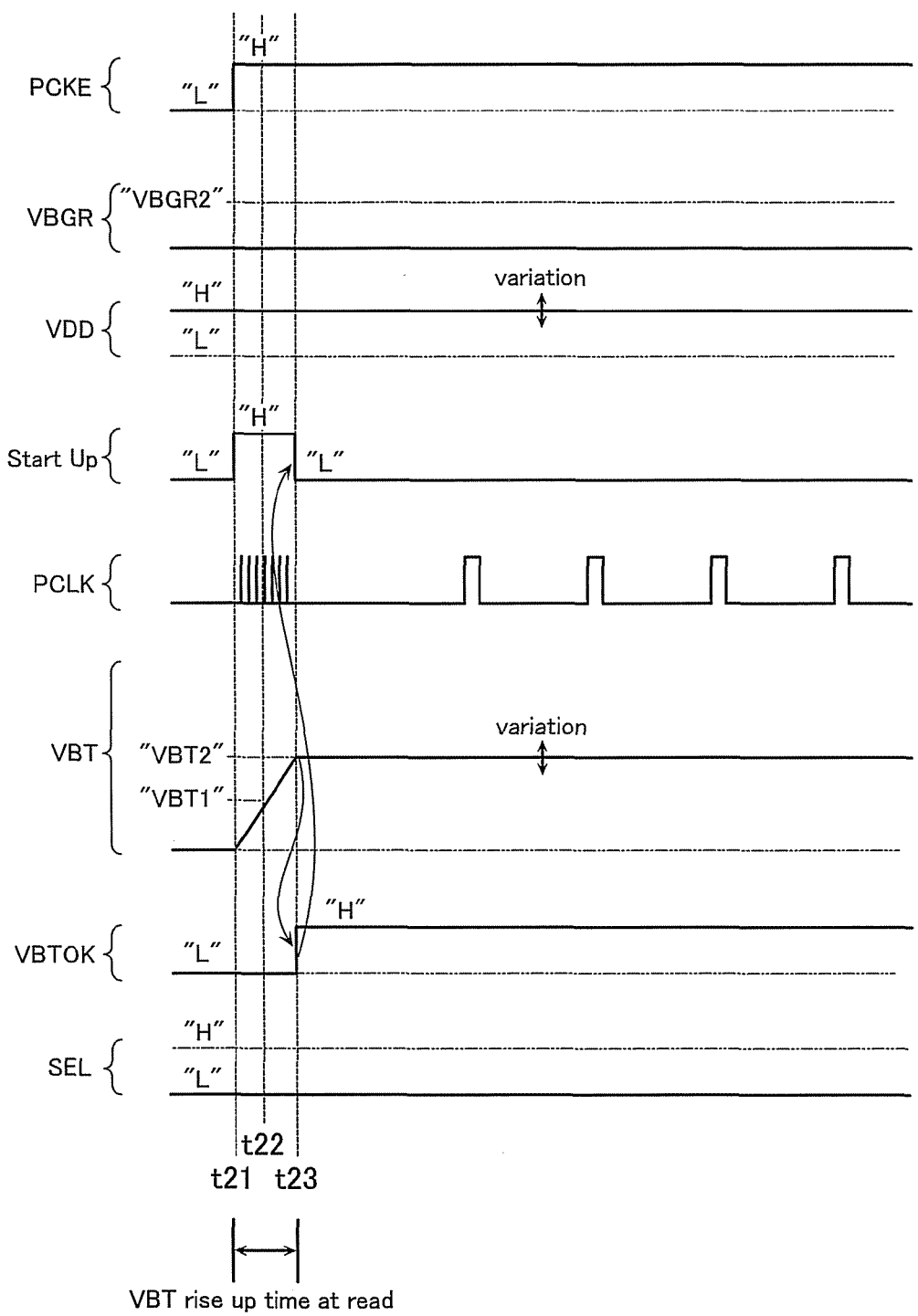

US 8,248,865 B2

NONVOLATILE SEMICONDUCTOR MEMORY DEVICE, METHOD OF SUPPLYING VOLTAGE IN THE SAME, AND SEMICONDUCTOR DEVICE

CROSS-REFERENCE TO RELATED APPLICATIONS

This application is based upon and claims the benefit of priority from the prior Japanese Patent Application No. 2010-95580, filed on Apr. 19, 2010, the entire contents of which are incorporated herein by reference.

FIELD

Embodiments described in this specification relate to an electrically programmable nonvolatile semiconductor memory device, a method of supplying voltage in the same, and a semiconductor device.

BACKGROUND

In recent years, electrically rewritable nonvolatile semiconductor memory devices have become indispensable in redundancy rescue of large-capacity memory devices such as DRAM and SRAM, tuning of analog circuits, storage of chip ID, and so on.

In order to provide the above-mentioned nonvolatile semiconductor memory devices at a cheap price, there is need of a storage element mountable only by a CMOS standard process. An antifuse element is a storage element that fulfills such a requirement.

An antifuse element includes a gate oxidation film. The antifuse element is in a high-resistance state when the gate oxidation film is intact, and stores this state as data "0". Moreover, the antifuse element attains a low-resistance state due to the gate oxidation film being destroyed, and stores this state as data "1". For example, a write operation is executed by applying a high voltage to the gate oxidation film thereby destroying the gate oxidation film. Further, a read operation is executed by applying to the gate oxidation film a voltage insufficient for the gate oxidation film to be destroyed and detecting a current flowing in the antifuse element.

However, power consumption in the write operation and read operation of the antifuse element is not sufficiently suppressed, neither is operation speed sufficiently increased.

BRIEF DESCRIPTION OF THE DRAWINGS

FIG. 7 is a timing chart showing a read operation in the nonvolatile semiconductor memory device in accordance with the embodiment.

DETAILED DESCRIPTION

Figure 1:
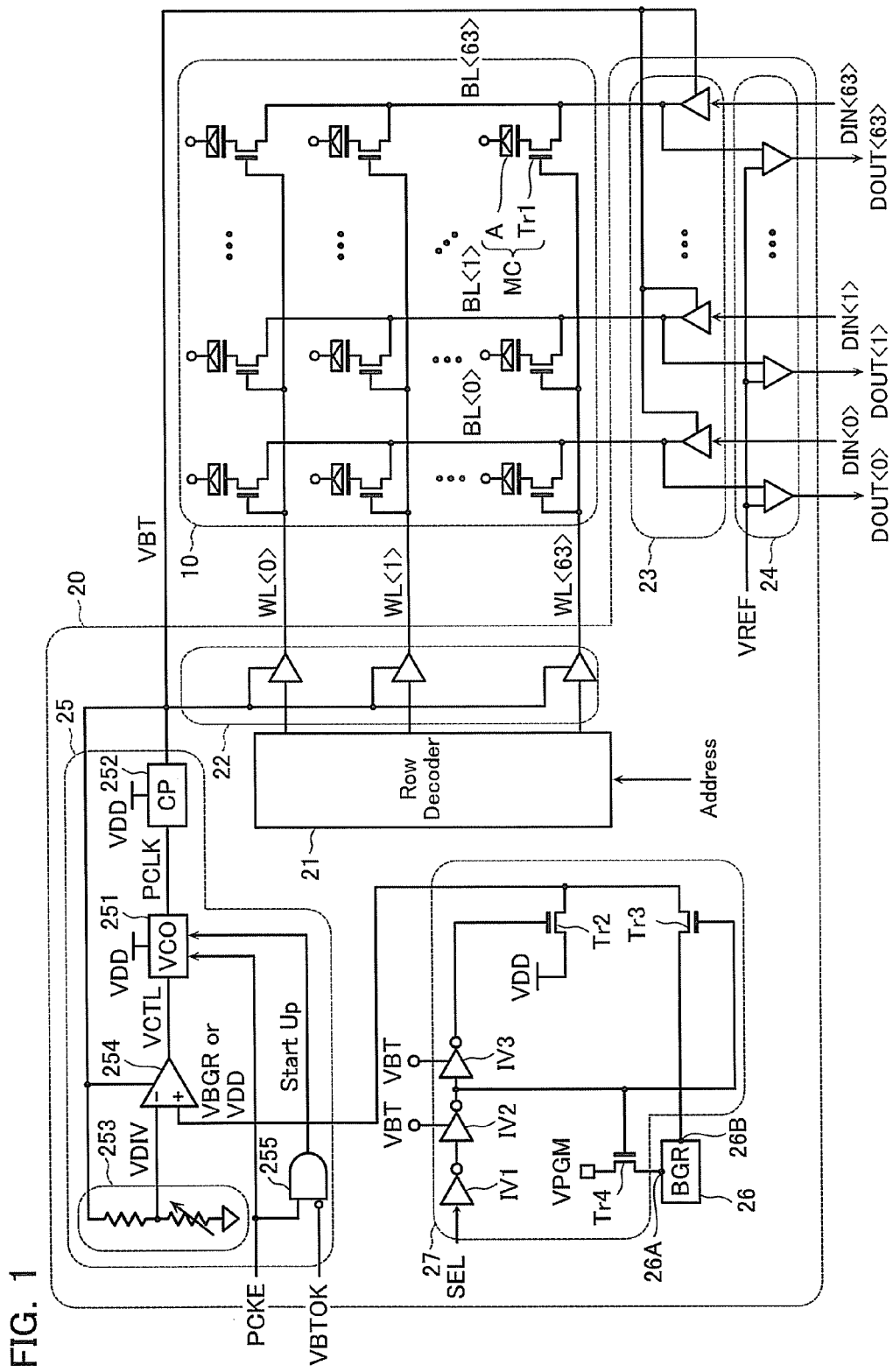
FIG. 1 is a circuit diagram of a nonvolatile semiconductor memory device in accordance with an embodiment.

A nonvolatile semiconductor memory device in accordance with an embodiment includes a memory cell array, a first voltage generating circuit, a second voltage generating circuit, and a selector circuit. The memory cell array is configured as an arrangement of memory cells. The first voltage generating circuit is configured to, during a write operation on the memory cells, generate and supply to the memory cell array a first voltage from a constant voltage, and to, during a read operation on the memory cells, generate and supply to the memory cell array a second voltage from a power supply voltage. The second voltage generating circuit is configured to generate the constant voltage. The selector circuit is configured to, during the write operation, drive the second voltage generating circuit to supply to the first voltage generating circuit the constant voltage, and to, during the read operation, stop the second voltage generating circuit and supply to the first voltage generating circuit the power supply voltage.

A semiconductor device in accordance with an embodiment includes a first voltage generating circuit, a second voltage generating circuit, and a selector circuit. The first voltage generating circuit is configured to, during a write operation on memory cells, generate and supply to a memory cell array configured as an arrangement of the memory cells a first voltage from a constant voltage, and to, during a read operation on the memory cells, generate and supply to the memory cell array a second voltage from a power supply voltage. The second voltage generating circuit is configured to generate the constant voltage. The selector circuit is configured to, during the write operation, drive the second voltage generating circuit to supply to the first voltage generating circuit the constant voltage, and to, during the read operation, stop the second voltage generating circuit and supply to the first voltage generating circuit the power supply voltage.

A method of supplying voltage in a nonvolatile semiconductor memory device in accordance with an embodiment, the nonvolatile semiconductor memory device includes a memory cell array configured as an arrangement of memory cells, a first voltage generating circuit configured to generate a first voltage from a constant voltage or to generate a second voltage from a power supply voltage, and a second voltage generating circuit configured to generate the constant voltage. The method includes during a write operation on the memory cells, driving the second voltage generating circuit to supply the constant voltage to the first voltage generating circuit, and generating the first voltage in the first voltage generating circuit and supplying the first voltage to the memory cell array, and, during a read operation, stopping the second voltage generating circuit and supplying the power supply voltage to the first voltage generating circuit, and generating the second voltage in the first voltage generating circuit and supplying the second voltage to the memory cell array.

Next, embodiments of a nonvolatile semiconductor memory device are described with reference to the drawings.

A schematic configuration of a nonvolatile semiconductor memory device in accordance with an embodiment is described with reference to FIG. 1. FIG. 1 shows a circuit diagram of the nonvolatile semiconductor memory device in accordance with the embodiment.

As shown in FIG. 1, the nonvolatile semiconductor memory device in accordance with the embodiment includes a memory cell array 10 and a control circuit 20. The memory cell array 10 is configured by a plurality of memory cells MC arranged in a matrix. The control circuit 20 executes write of data to the memory cell array 10 and read of data from the memory cell array 10. As shown in FIG. 1, the control circuit 20 includes a row decoder 21, a word line driver 22, a bit line driver 23, a sense amplifier 24, an internal voltage generating circuit (first voltage generating circuit) 25, a band gap reference circuit (second voltage generating circuit) 26, and a selector circuit 27.

The memory cell array 10 includes a plurality of word lines WL<0>-<63>, a plurality of bit lines BL<0>-<63> intersecting the word lines WL, and the plurality of memory cells MC positioned at intersections of these word lines WL and bit lines BL. The word lines WL are formed extending in a row direction and having a certain pitch in a column direction. The bit lines BL are formed extending in the column direction and having a certain pitch in the row direction. The memory cells MC are formed in a matrix in the column direction and the row direction.

Each of the memory cells MC includes an NMOS transistor Tr1, and an antifuse element A having one end connected to one end of the NMOS transistor Tr1. The NMOS transistor Tr1 has its other end connected to the bit line BL and its gate connected to the word line WL. The antifuse element A has its other end applied with, during a write operation, a program voltage VEP (for example, 6V), and, during a write operation, a read voltage VBR.

The antifuse element A is configured by, for example, a PMOS transistor having drain, source and substrate terminal short-circuited. Moreover, prior to destruction of a gate insulating film in this MOS transistor, the antifuse element A has a high resistance value (for example, several GΩ). Furthermore, when the antifuse element A has both ends applied with a certain program voltage thereby destroying its gate insulating film, the resistance value of the antifuse element A decreases (to, for example, several MΩ). The nonvolatile semiconductor memory device in accordance with the present embodiment stores one bit of data in one memory cell MC based on an irreversible change in the resistance value of the antifuse element A.

The row decoder 21 receives an address signal Address from external and supplies a signal based on that address signal Address to the word line driver 22. The address signal Address is a signal for specifying a row in the memory cell array 10. The word line driver 22 supplies the signal from the row decoder 21 to the word lines WL<0>-<63> based on a boost voltage VBT (first voltage, second voltage) from the internal voltage generating circuit 25.

The bit line driver 23 receives signals DIN<0>-<63> from external. The bit line driver 23 supplies the signals DIN<0>-<63> to the bit lines BL<0>-<63> based on the boost voltage VBT from the internal voltage generating circuit 25. The sense amplifier 24 compares a voltage of each of the bit lines BL<0>-<63> with a reference voltage VREF, and outputs signals DOUT<0>-<63> based on that comparison to external.

As mentioned above, during the write operation, the antifuse element A has one end applied with a high voltage of the program voltage VBP (about 6 V). Thus, during the write operation, the word line driver 22 and the bit line driver 23 are supplied with a boost voltage VBT between the program voltage VBP and a ground voltage (about 2.2-4.1 V). As a result, damage arising in the word line driver 22 and the bit line driver 23 due to the program voltage VBP is suppressed by the boost voltage VBT.

The internal voltage generating circuit 25 generates a boost voltage VBT from different voltages for the write operation and the read operation. During the write operation, the internal voltage generating circuit 25 generates a boost voltage VBT (first voltage) from a constant voltage VBGR, and supplies this boost voltage VBT to the word line driver 22 and the bit line driver 23. Now, during the write operation, the constant voltage VBGR is constant irrespective of a power supply voltage VDD and a voltage VPGM. The voltage VPGM is a voltage used when driving the band gap reference circuit 26. In addition, during the read operation, the internal voltage generating circuit 25 does not use the constant voltage VBGR, but instead generates a boost voltage VBT (second voltage) from the power supply voltage VDD, and supplies this boost voltage VBT to the word line driver 22 and the bit line driver 23.

Now, the constant voltage VBGR is generated using the band gap reference circuit 26 as described hereafter, and requires time to converge on a constant value subsequent to turn-on of power supply to the band gap reference circuit 26. Thus, by generating the boost voltage VBT from the power supply voltage VDD during the read operation, the internal voltage generating circuit 25 attains an improvement in read speed. On the other hand, a voltage value of the power supply voltage VDD sometimes fluctuates due to ambient temperature and so on. Thus, by generating the boost voltage VBT from the constant voltage VBGR rather than the power supply voltage VDD during the write operation, the internal voltage generating circuit 25 prevents fluctuation in write characteristics or read characteristics.

The internal voltage generating circuit 25 includes a voltage control oscillator (VCO) 251, a charge pump (CP) 252, a voltage-dividing circuit 253, a differential amplifier 254, and a NAND circuit 255, as shown in FIG. 1. The voltage control oscillator 251 outputs a clock signal PCLK of high oscillation frequency when a control voltage VCTL is high, and outputs a clock signal PCLK of low oscillation frequency when the control voltage VCTL is low. Moreover, the voltage control oscillator 251 outputs a clock signal PCLK based on a start voltage StartUp instead of the control voltage VCTL. In addition, the voltage control oscillator 251 has its operation controlled by an oscillation enable signal PCKE.

The charge pump 252 receives the clock signal PCLK and performs a boost operation synchronized with the clock signal PCLK to generate the boost voltage VBT. In addition, the charge pump 252 supplies the boost voltage VBT to the word line driver 22 and the bit line driver 23.

The voltage-dividing circuit 253 employs a splitting resistance to voltage-divide the boost voltage VBT, thereby generating and outputting a monitor voltage VDIV. The differential amplifier 254 has its inverting input terminal "−" supplied with the monitor voltage VDIV and its non-inverting input terminal "+" supplied with the constant voltage VBGR or the power supply voltage VDD. In addition, the differential amplifier 254 amplifies a differential between those supplied voltages VBGR or VDD and VDIV to output the control voltage VCTL.

The NAND circuit 255 receives at its non-inverting input terminal the oscillation enable signal PCKE, and receives at its inverting input terminal a signal VBTOK. In addition, the NAND circuit 255 generates the start voltage StartUp from a negative AND of the oscillation enable signal PCKE and an inverted signal of the signal VBTOK, and supplies the start voltage StartUp to the voltage control oscillator 251.

The band gap reference circuit 26 receives supply of the voltage VPGM from its input terminal 26A and generates the constant voltage VBGR which is constant irrespective of fluctuations in the power supply voltage VDD and voltage VPGM due to changes in ambient temperature. In addition, the band gap reference circuit 26 supplies the constant voltage VBGR from its output terminal 26B to the selector circuit 27. The voltage VPGM is supplied to the band gap reference circuit 26 only during the write operation, and is not supplied to the band gap reference circuit 26 at other times. The band gap reference circuit 26 is thus stopped at times other than during the write operation.

During the write operation, the selector circuit 27 drives the band gap reference circuit 26 to supply the constant voltage VBGR to the internal voltage generating circuit 25. On the other hand, during the read operation, the selector circuit 27 stops the band gap reference circuit 26 and supplies the power supply voltage VDD to the internal voltage generating circuit 25.

The selector circuit 27 includes NMOS transistors Tr2-Tr4 and inverters IV1-IV3. The NMOS transistors Tr2 and Tr3 have their sources commonly connected to the non-inverting input terminal "+" of the differential amplifier 254. The NMOS transistor Tr2 has its drain supplied with the power supply voltage VDD, and the NMOS transistor Tr3 has its drain connected to the output terminal 26B of the band gap reference circuit 26. The NMOS transistor Tr4 has its source connected to the input terminal 26A of the band gap reference circuit 26 and its drain supplied with the voltage VPGM.

The inverters IV1-IV3 are connected in series and configure a single signal output circuit. The input terminal of the inverter IV1 receives a select signal SEL. The inverter IV2 has its output terminal connected to gates of the NMOS transistors Tr3 and Tr4, and the inverter IV3 has its output terminal connected to the gate of the NMOS transistor Tr2. In addition, the inverters IV2 and IV3 are supplied with a voltage VBT.

Figure 2:
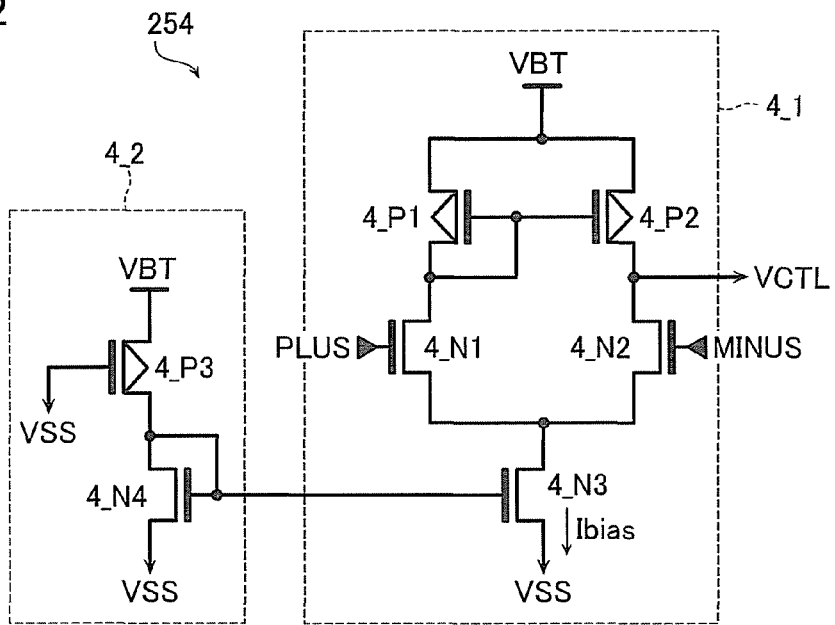
FIG. 2 is a circuit diagram showing a differential amplifier 254 in FIG. 1.

Next, a circuit configuration of the differential amplifier 254 is described specifically with reference to FIG. 2. As shown in FIG. 2, the differential amplifier 254 includes a differential input unit 4_1 and a bias circuit 4_2 for controlling a bias current Ibias flowing in the differential input unit 4_1.

The differential input unit 4_1 includes: a differential pair configured from an NMOS transistor 4_N1 that has its gate connected to a non-inverting input terminal PLUS ("+" in FIG. 1); and an NMOS transistor 4_N2 that has its gate connected to an inverting input terminal MINUS ("−" in FIG. 1). These NMOS transistors 4_N1 and 4_N2 have their sources supplied with a ground voltage VSS, both via an NMOS transistor 4_N3. In addition, the NMOS transistors 4_N1 and 4_N2 have their drains supplied with the boost voltage VBT, via, respectively, load-constituting PMOS transistors 4_P1 and 4_P2. These PMOS transistors 4_P1 and 4_P2 have their gates commonly connected to the drain of the NMOS transistor 4_N1.

The bias circuit 4_2 includes a PMOS transistor 4_P3 and an NMOS transistor 4_N4. The PMOS transistor 4_P3 has its source supplied with the boost voltage VBT and its gate supplied with the ground voltage VSS. The NMOS transistor 4_N4 has its source supplied with the ground voltage VSS and its drain and gate connected to the drain of the PMOS transistor 4_P3.

Furthermore, the gate of the NMOS transistor 4_N3 in the differential input unit 4_1 and the gate of the NMOS transistor 4_N4 in the bias circuit 4_2 are connected to configure a current mirror circuit. This configuration causes a voltage of the drains of the NMOS transistor 4_N2 and PMOS transistor 4_P2 to attain the control voltage VCTL which is an output of the differential amplifier 254.

Figure 3:
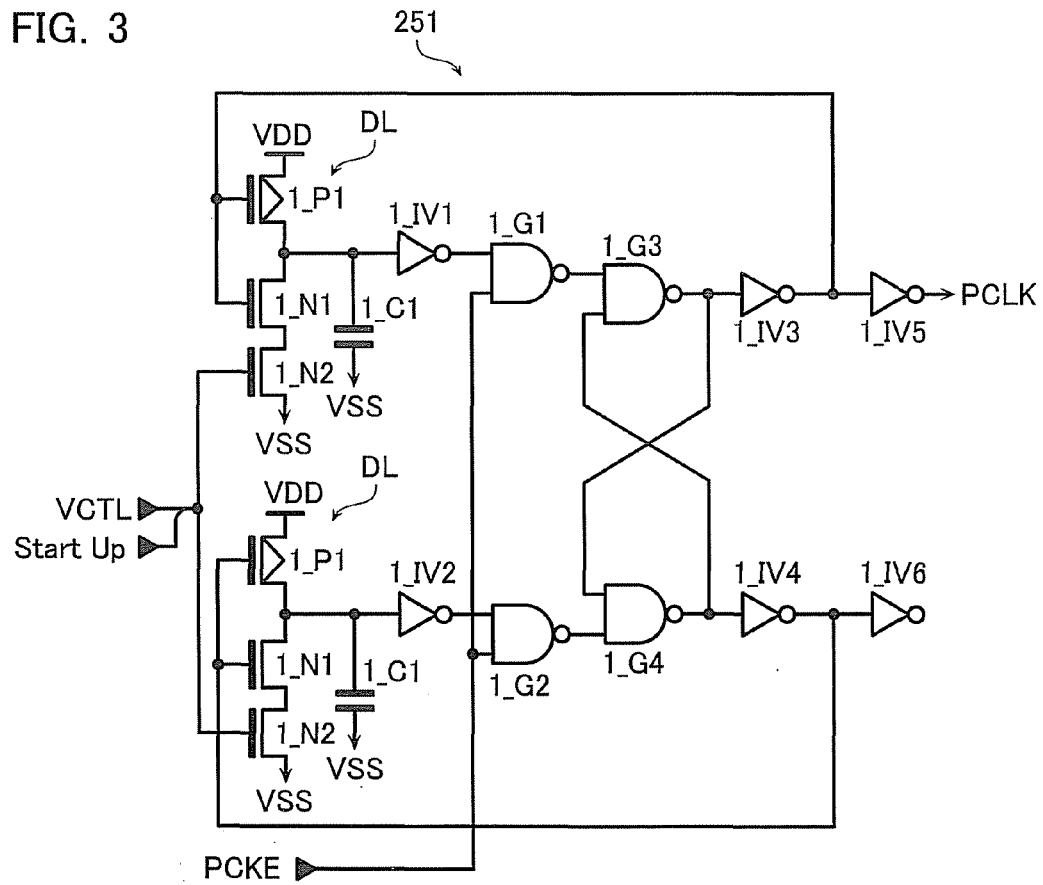
FIG. 3 is a circuit diagram showing a voltage control oscillator 251 in FIG. 1.

Next, a circuit configuration of the voltage control oscillator 251 is described specifically with reference to FIG. 3. The voltage control oscillator 251 includes NAND gates 1_G1-1_G4 and inverters 1_IV1-1_IV6. A pair of the NAND gates 1_G3 and 1_G4 is flip-flop connected. The NAND gates 1_G1 and 1_G2 have their output terminals connected respectively to one of input terminals of the NAND gates 1_G3 and 1_G4, and control oscillation start/stop by the oscillation enable signal PCKE. The inverters 1_IV1 and 1_IV2 have their output terminals connected respectively to input terminals of the NAND gates 1_G1 and 1_G2. The inverters 1_IV3 and 1_IV5 are connected in series to the output terminal of the NAND gate 1_G3, and the inverters 1_IV4 and 1_IV6 are connected in series to the output terminal of the NAND gate 1_G4.

The inverters 1_IV3 and 1_IV4 have their output terminals connected respectively via delay circuits DL to input terminals of the inverters 1_IV1 and 1_IV2. Each of the delay circuits DL includes a PMOS transistor 1_P1 and NMOS transistors 1_N1 and 1_N2 connected in series between a power supply line (power supply voltage VDD) and a ground line (ground voltage VSS), and a capacitor 1_C1 connected between a connection point of the transistors 1_P1 and 1_N1 and the ground line (ground voltage VSS).

The above-described configuration causes the clock signal PCLK, which is to be applied to the charge pump 252, to be outputted from the output terminal of the inverter 1_IV5. The voltage control oscillator 251 controls the oscillation frequency of the clock signal PCLK by the NMOS transistors 1_N1 and 1_N2 which are variable current elements.

Figure 4:
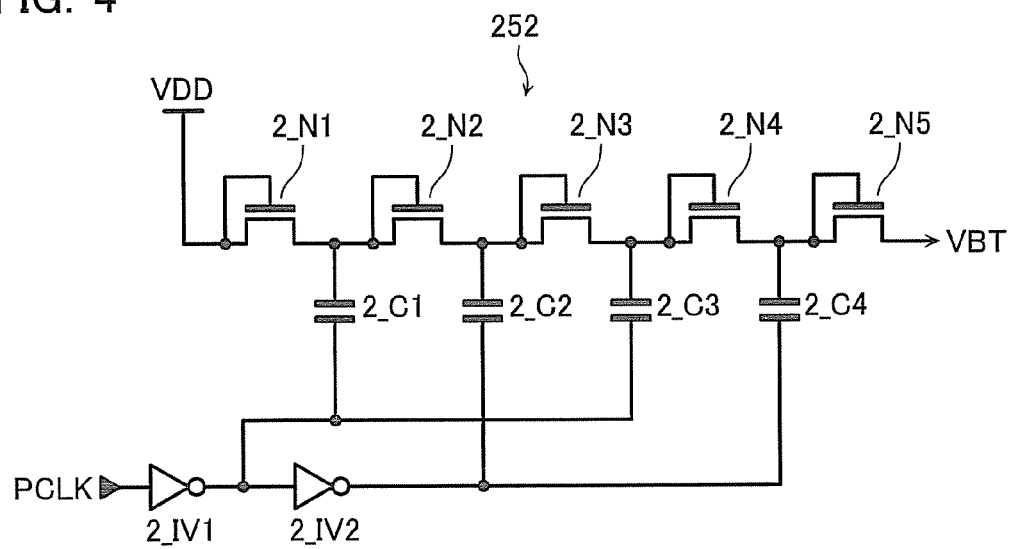
FIG. 4 is a circuit diagram showing a charge pump 252 in FIG. 1.

Next, a circuit configuration of the charge pump 252 is described specifically with reference to FIG. 4. As shown in FIG. 4, the charge pump 252 includes NMOS transistors 2_N1-2_N5 and pumping capacitors 2_C1-2_C4. The NMOS transistors 2_N1-2_N5 each have drains and gates connected, and are continuously connected between an input terminal of the power supply voltage VDD and an output terminal of the boost voltage VBT. The first stage NMOS transistor 2_N1 has its drain supplied with the power supply voltage VDD. In addition, sources of NMOS transistors 2_Ni (where i=integer, 1-4) and drains of NMOS transistors 2_Ni+1 are respectively connected.

The pumping capacitors 2_C1-2_C4 have their one ends connected, respectively, to sources of the NMOS transistors 2_N1-2_N4. The clock signal PCLK is supplied via the inverter 2_IV1 to each of the other ends of the capacitors 2_C1 and 2_C3, and is supplied via the inverters 2_IV1 and 2_IV2 to each of the other ends of the capacitors 2_C2 and 2_C4.

The charge pump 252 configured in this way forms a four stage Dickson charge pump and outputs the boost voltage VBT from the drain of the NMOS transistor 2_N5.

Figure 5:
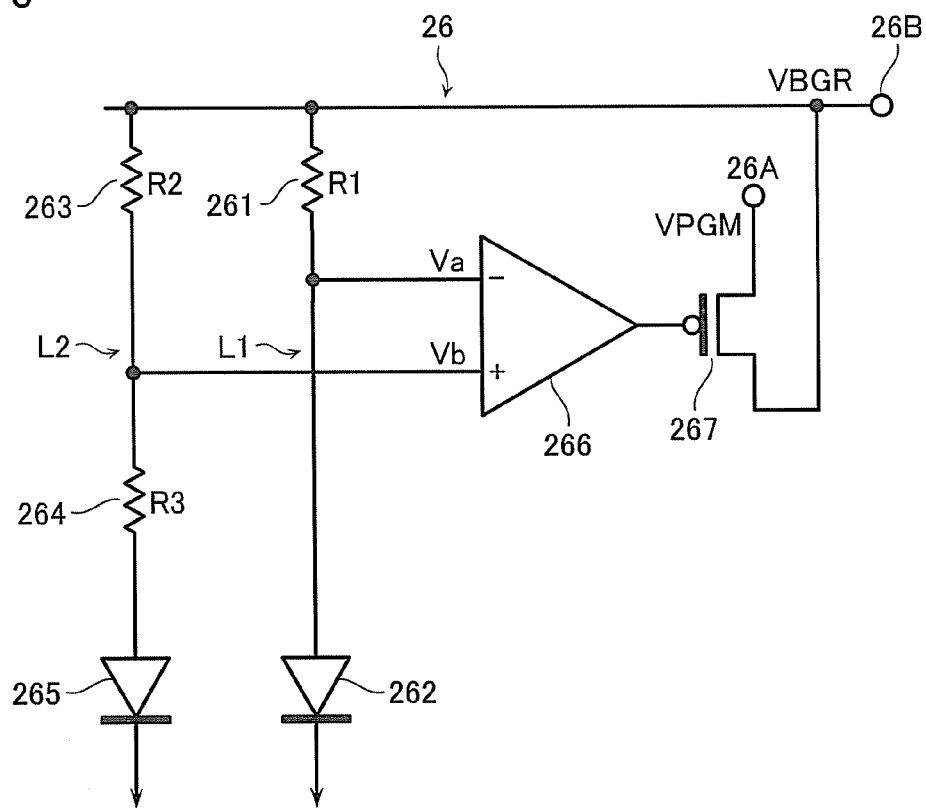
FIG. 5 is a circuit diagram showing a band gap reference circuit 26 in FIG. 1.

Next, a circuit configuration of the band gap reference circuit 26 is described specifically with reference to FIG. 5. As shown in FIG. 5, the band gap reference circuit 26 includes a first current path L1 and a second current path L2. The first current path L1 includes a resistor 261 (resistance value R1) and a diode 262 connected in series between the output terminal 26B and the ground line (ground voltage VSS). The second current path L2 includes a resistor 263 (resistance value R2), a resistor 264 (resistance value R3) and a diode 265 connected in series between the output terminal 26B and the ground line (ground voltage VSS). The diode 265 is assumed to have an area N times that of the diode 262, for example.

In addition, the band gap reference circuit 26 includes an operational amplifier 266 and a MOS transistor 267. The operational amplifier 266 has its non-inverting input terminal "+" connected to a connection point of the resistor 263 and the resistor 264, and its inverting input terminal "−" connected to a connection point of the resistor 261 and the diode 262. The operational amplifier 266 compares an input voltage Va of the inverting input terminal "−" and an input voltage Vb of the non-inverting input terminal "+" and controls an output voltage such that these input voltages Va and Vb become equal.

The MOS transistor 267 has its gate connected to the output terminal of the operational amplifier 266. In addition, the MOS transistor 267 has its drain applied with the voltage VPGM as the input terminal 26A of this band gap reference circuit 26, and, moreover, has its source connected to the output terminal 26B.

Figure 6:
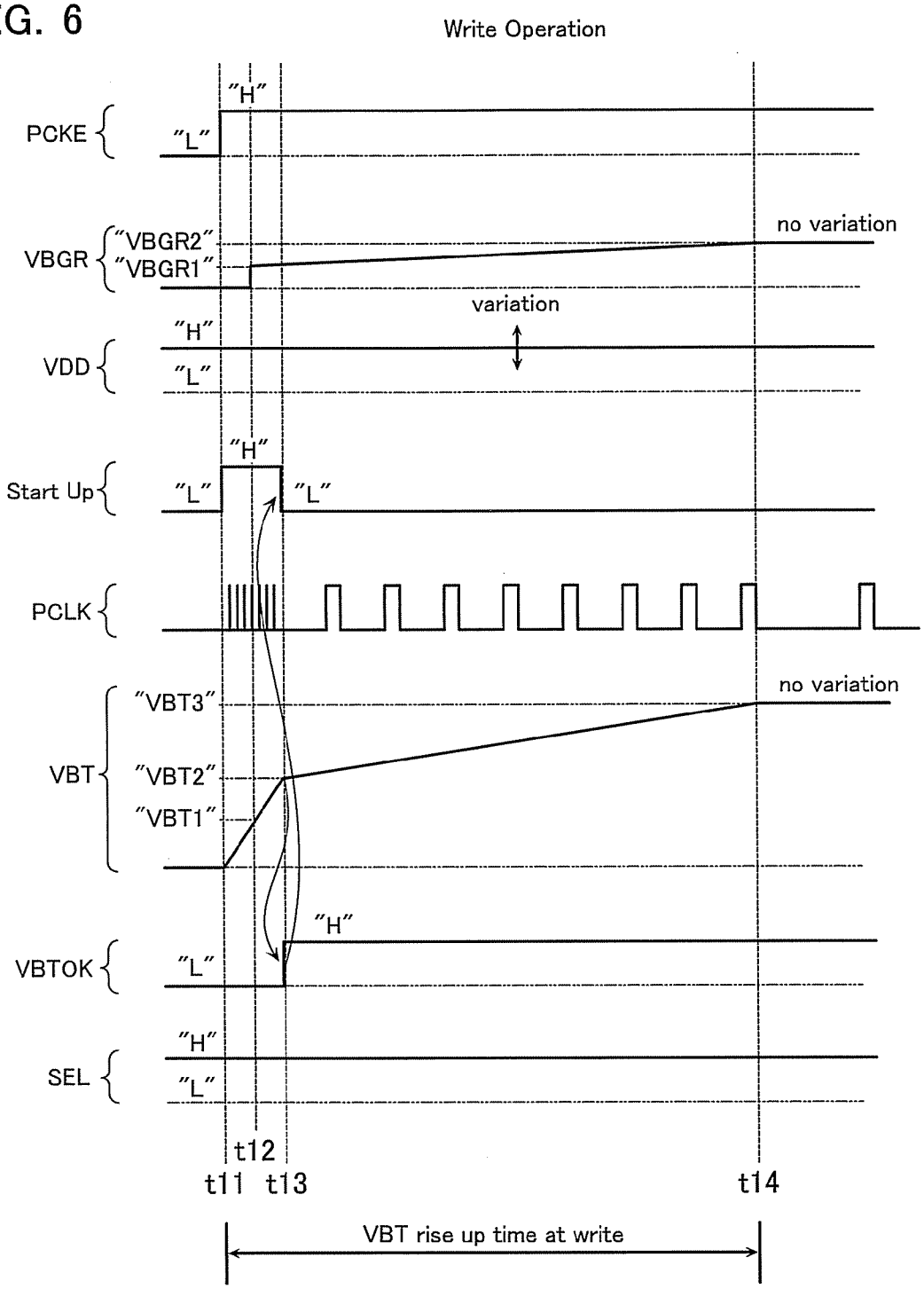
FIG. 6 is a timing chart showing a write operation in the nonvolatile semiconductor memory device in accordance with the embodiment.

Next, operation of the nonvolatile semiconductor memory device in accordance with the embodiment is described with reference to FIGS. 1, 6, and 7. FIG. 6 shows the write operation in the nonvolatile semiconductor memory device in accordance with the embodiment, and FIG. 7 shows the read operation in the nonvolatile semiconductor memory device in accordance with the embodiment.

First, the write operation is described with reference to FIGS. 1 and 6. First, prior to time t11 in FIG. 6, the oscillation enable signal PCKE and the start voltage StartUp, which are set to an "L" state voltage, cause oscillation operation of the voltage control oscillator 251 to be suppressed such that the clock signal PCLK, which is an output of the voltage control oscillator 251, is maintained at an "L" state. Hence, the charge pump 252, which receives and is activated by the clock signal PCLK, is in a stop state, and the boost voltage VBT is substantially 0 V. In addition, prior to time t11, voltage of the select signal SEL is set to an "H" state.

First, at time t11, the oscillation enable signal PCKE attains "H" state from "L" state. This causes the start voltage StartUp to attain "H" state from "L" state. Further, the voltage control oscillator 251 outputs the clock signal PCLK based on these oscillation enable signal PCKE and start voltage Startup. In addition, the charge pump 252 starts boost of the boost voltage VBT based on this clock signal PCLK. That is, subsequent to time t11, boost of the boost voltage VBT is controlled based on the start voltage StartUp.

Then, at time t12, when the boost voltage VBT reaches a voltage value VBT1, the NMOS transistors Tr3 and Tr4 are turned on based on the select signal SEL which is in "H" state, while the NMOS transistor Tr2 is maintained in an off state. Further, the voltage VPGM is supplied to the band gap reference circuit 26 via the NMOS transistor Tr4, causing the band gap reference circuit 26 to start drive. Consequently, subsequent to time t12, the constant voltage VBGR is supplied to the non-inverting input terminal "+" of the differential amplifier 254 via the NMOS transistor Tr3, while rising from a voltage value VBGR1.

Next, at time t13, when the boost voltage VBT reaches a voltage VBT2 (for example, 2.2 V), the signal VBTOK switches from "L" state to "H" state. This causes the start voltage StartUp to attain "L" state from "H" state. That is, subsequent to time t13, boost of the boost voltage VBT is controlled based on the constant voltage VBGR instead of on the start voltage StartUp.

Then, at time t14, the constant voltage VBGR stabilizes after rising to a voltage value VBGR2 (time interval between time t13 and time t14 is 5 μsec, for example). This causes the boost voltage VBT to stabilize after rising to a voltage value VBT3 (for example, 4.1 V) based on the constant voltage VBGR. Then, subsequent to time t14, the memory cell MC is applied with a write voltage based on the boost voltage VBT boosted to the voltage value VBT3.

As shown above, in the write operation, the boost voltage VBT is generated from the constant voltage VBGR and is thus set to the voltage value VBT3 without error. That is, in the present embodiment, the boost voltage VBT allows the write operation to be executed accurately.

Next, the read operation is described with reference to FIGS. 1 and 7. First, prior to time t21, the charge pump 252 is in a stop state and the boost voltage VBT is substantially 0 V, similarly to the write operation. In contrast, prior to time t21, the select signal SEL is set to "L" state.

First, at time t21, similar control is executed to that at time t11 of the write operation, whereby boost of the boost voltage VBT is controlled based on the start voltage StartUp. Subsequently, at time t22, when the boost voltage VBT reaches the voltage value VBT1, the NMOS transistor Tr2 is turned on based on the select signal SEL which is in "L" state, while the NMOS transistors Tr3 and Tr4 are maintained in an off state. This causes the power supply voltage VDD to be supplied to the non-inverting input terminal "+" of the differential amplifier 254 via the NMOS transistor Tr2, while the band gap reference circuit 26 is maintained in a non-drive state.

Next, at time t23, similar control is executed to that at time t13 of the write operation, whereby boost of the boost voltage VBT is controlled based on the power supply voltage VDD instead of on the start voltage StartUp. This causes the boost voltage VBT to remain at the voltage value VBT2 subsequent to time t23 based on the power supply voltage VDD. Then, subsequent to time t23, the memory cell MC is applied with a read operation associated voltage based on the boost voltage VBT boosted to the voltage value VBT2.

As shown above, the read operation uses the power supply voltage VDD in boost of the boost voltage VBT, and thus does not require a time for the constant voltage VBGR to stabilize as shown at times t13-t14 in the write operation (refer to FIG. 6). That is, the present embodiment allows the read operation to be executed more rapidly than the write operation. Note that, during the read operation, the antifuse element A exhibits similar voltage-current characteristics to a resistance element, and there is thus no effect on read accuracy even if the boost voltage VBT is generated from the power supply voltage VDD which may fluctuate due to changes in ambient temperature and so on, rather than on the constant voltage VBGR.

Moreover, in the read operation as described above, drive of the band gap reference circuit 26 is stopped. Consequently, the present embodiment enables electric power consumed in drive of the band gap reference circuit 26 during the read operation to be cut.

Other Embodiments

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the memory cell MC may include a fuse element instead of the antifuse element A. Note that a fuse element is an element that attains a high-resistance state through destruction of the insulating film configuring the element.

What is claimed is:

1. A nonvolatile semiconductor memory device, comprising:
  a memory cell array configured as an arrangement of memory cells;
  a first voltage generating circuit configured to, during a write operation on the memory cells, generate and supply to the memory cell array a first voltage from a constant voltage, and to, during a read operation on the memory cells, generate and supply to the memory cell array a second voltage from a power supply voltage;

a second voltage generating circuit configured to generate the constant voltage; and a selector circuit configured to, during the write operation, drive the second voltage generating circuit to supply to the first voltage generating circuit the constant voltage, and to, during the read operation, stop the second voltage generating circuit and supply to the first voltage generating circuit the power supply voltage.

2. The nonvolatile semiconductor memory device of claim 1, wherein the selector circuit further comprises:

a first transistor connected between an input terminal of the first voltage generating circuit and an output terminal of the second voltage generating circuit;

a second transistor having one end connected to the input terminal of the first voltage generating circuit and the other end supplied with the power supply voltage;

a third transistor configured to supply to the second voltage generating circuit a third voltage for driving the second voltage generating circuit; and a signal output circuit configured to output a first signal to gates of the first and third transistors, and to output a second signal to a gate of the second transistor, the second signal being an inverted signal of the first signal.

3. The nonvolatile semiconductor memory device of claim 1, wherein the first voltage generating circuit comprises:

a voltage control oscillator configured to change an oscillation frequency of a clock signal in response to a control voltage inputted;

a charge pump configured to perform a boost operation synchronized with the clock signal and output a boost voltage;

a voltage-dividing circuit configured to voltage-divide the boost voltage to output a monitor voltage; and a differential amplifier configured to amplify a differential between the monitor voltage and the constant voltage or the power supply voltage to output the control voltage.

4. The nonvolatile semiconductor memory device of claim 3, wherein the differential amplifier comprises:

a first input terminal supplied with the monitor voltage; and a second input terminal supplied with the constant voltage or the power supply voltage.

5. The nonvolatile semiconductor memory device of claim 1, wherein each of the memory cells includes a resistance varying element configured to vary a resistance value.

6. The nonvolatile semiconductor memory device of claim 5, wherein each of the memory cells further comprises a transistor having one end connected to one end of the resistance varying element.

7. The nonvolatile semiconductor memory device of claim 5, wherein the resistance varying element is configured by an antifuse element.

8. The nonvolatile semiconductor memory device of claim 5, wherein the resistance varying element is configured by a fuse element.

9. The nonvolatile semiconductor memory device of claim 1, wherein the second voltage generating circuit is configured by a band gap reference circuit.

10. A semiconductor device, comprising:

a first voltage generating circuit configured to, during a write operation on memory cells, generate and supply to a memory cell array configured as an arrangement of the memory cells a first voltage from a constant voltage, and to, during a read operation on the memory cells, generate and supply to the memory cell array a second voltage from a power supply voltage;

a second voltage generating circuit configured to generate the constant voltage; and a selector circuit configured to, during the write operation, drive the second voltage generating circuit to supply to the first voltage generating circuit the constant voltage, and to, during the read operation, stop the second voltage generating circuit and supply to the first voltage generating circuit the power supply voltage.

11. The semiconductor device of claim 10, wherein the selector circuit further comprises:

a first transistor connected between an input terminal of the first voltage generating circuit and an output terminal of the second voltage generating circuit;

a second transistor having one end connected to the input terminal of the first voltage generating circuit and the other end supplied with the power supply voltage;

a third transistor configured to supply to the second voltage generating circuit a third voltage for driving the second voltage generating circuit; and a signal output circuit configured to output a first signal to gates of the first and third transistors, and to output a second signal to a gate of the second transistor, the second signal being an inverted signal of the first signal.

12. The semiconductor device of claim 10, wherein the first voltage generating circuit comprises:

a voltage control oscillator configured to change an oscillation frequency of a clock signal in response to a control voltage inputted;

a charge pump, configured to perform a boost operation synchronized with the clock signal and output a boost voltage;

a voltage-dividing circuit configured to voltage-divide the boost voltage to output a monitor voltage; and a differential amplifier configured to amplify a differential between the monitor voltage and the constant voltage or the power supply voltage to output the control voltage.

13. The semiconductor device of claim 12, wherein the differential amplifier comprises:

a first input terminal supplied with the monitor voltage; and a second input terminal supplied with the constant voltage or the power supply voltage.

14. The semiconductor device of claim 10, wherein each of the memory cells includes a resistance varying element configured to vary a resistance value.

15. The semiconductor device of claim 14, wherein each of the memory cells further comprises a transistor having one end connected to one end of the resistance varying element.

16. The semiconductor device of claim 14, wherein the resistance varying element is configured by an antifuse element.

17. The semiconductor device of claim 14, wherein the resistance varying element is configured by a fuse element.

18. The semiconductor device of claim 10, wherein the second voltage generating circuit is configured by a band gap reference circuit.

19. A method of supplying voltage in a nonvolatile semiconductor memory device, the nonvolatile semiconductor memory device comprising:

a memory cell array configured as an arrangement of memory cells;

a first voltage generating circuit configured to generate a first voltage from a constant voltage, or to generate a second voltage from a power supply voltage; and a second voltage generating circuit configured to generate the constant voltage, the method comprising:

during a write operation on the memory cells, driving the second voltage generating circuit to supply the constant voltage to the first voltage generating circuit, and generating the first voltage in the first voltage generating circuit and supplying the first voltage to the memory cell array; and during a read operation, stopping the second voltage generating circuit and supplying the power supply voltage to the first voltage generating circuit, and generating the second voltage in the first voltage generating circuit and supplying the second voltage to the memory cell array.

20. The method of supplying voltage in a nonvolatile semiconductor memory device of claim 19, wherein each of the memory cells includes a resistance varying element configured to vary a resistance value.

* * * * *